(12) United States Patent
Meiser et al.

(10) Patent No.: US 7,982,284 B2
(45) Date of Patent: Jul. 19, 2011

(54) SEMICONDUCTOR COMPONENT INCLUDING AN ISOLATION STRUCTURE AND A CONTACT TO THE SUBSTRATE

(75) Inventors: Andreas Meiser, Unterhaching (DE); Walter Hartner, Bad Abbach-Peising (DE); Hermann Gruber, Worth O.D. (DE); Dietrich Bonart, Bad Abbach (DE); Thomas Gross, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 630 days.

(21) Appl. No.: 11/477,076

(22) Filed: Jun. 28, 2006

(65) Prior Publication Data

US 2008/0012090 A1 Jan. 17, 2008

(51) Int. Cl.
*H01L 21/763* (2006.01)
*H01L 27/105* (2006.01)

(52) U.S. Cl. ........ 257/520; 257/284; 257/301; 257/304; 257/305; 257/330; 257/332; 257/413; 257/755; 257/E27.091; 257/E27.092; 257/E21.585; 438/243; 438/248; 438/259; 438/270; 438/386; 438/391

(58) Field of Classification Search ............... 438/581, 438/583, 630, 651, 682, 242–248, 259, 270, 438/386–391; 257/381–385, 388, 413, 455–456, 257/576, 754–757, E21.438–E21.439, 301–302, 257/304–305, 311, 330, 332–334, 520, 257/ E27.091–E27.092, E29.346, E21.396, 257/E21.585, E21.564, E21.655, E29.121, 257/E29.26, E23.131

See application file for complete search history.

(56) References Cited

U.S. PATENT DOCUMENTS

| 4,320,411 A | 3/1982 | Fukushima |
| 4,688,069 A | 8/1987 | Joy et al. |
| 4,733,287 A | 3/1988 | Bower |
| 4,745,081 A | 5/1988 | Beyer et al. |
| 4,792,834 A | 12/1988 | Uchida |
| 4,910,567 A | 3/1990 | Malhi |

(Continued)

FOREIGN PATENT DOCUMENTS

CN 1244040 2/2000

(Continued)

OTHER PUBLICATIONS

De Pestel, F. et al., "Deep Trench Isolation for a 50V 0.35 um Based Smart Power Technology," IEEE, pp. 191-194 (2003).

(Continued)

*Primary Examiner* — Matthew C Landau
*Assistant Examiner* — Maliheh Malek
(74) *Attorney, Agent, or Firm* — Dicke, Billig & Czaja, PLLC

(57) ABSTRACT

A semiconductor component includes a semiconductor body, in which are formed: a substrate of a first conduction type, a buried semiconductor layer of a second conduction type arranged on the substrate, and a functional unit semiconductor layer of a third conduction type arranged on the buried semiconductor layer, in which at least two semiconductor functional units arranged laterally alongside one another are provided. The buried semiconductor layer is part of at least one semiconductor functional unit, the semiconductor functional units being electrically insulated from one another by an isolation structure which permeates the functional unit semiconductor layer, the buried semiconductor layer, and the substrate. The isolation structure includes at least one trench and an electrically conductive contact to the substrate, the contact to the substrate being electrically insulated from the functional unit semiconductor layer and the buried layer by the at least one trench.

15 Claims, 22 Drawing Sheets

U.S. PATENT DOCUMENTS

| | | | |
|---|---|---|---|
| 4,910,572 A | 3/1990 | Kameyama | |
| 4,980,747 A | 12/1990 | Hutter et al. | |
| 5,021,852 A | 6/1991 | Sukegawa et al. | |
| 5,614,750 A | 3/1997 | Ellul et al. | |
| 5,973,257 A * | 10/1999 | Cantarini et al. | 136/249 |
| 6,114,768 A | 9/2000 | Gaul et al. | |
| 6,121,102 A | 9/2000 | Norstrom et al. | |
| 6,265,741 B1 | 7/2001 | Schrems | |
| 6,690,080 B2 * | 2/2004 | Norstrom et al. | 257/499 |
| 7,323,745 B2 * | 1/2008 | Kinzer | 257/328 |
| 7,456,470 B2 * | 11/2008 | Jones | 257/331 |
| 2004/0256694 A1 * | 12/2004 | Kostylev et al. | 257/536 |
| 2006/0065923 A1 * | 3/2006 | Pfirsch | 257/328 |
| 2006/0113589 A1 * | 6/2006 | Jones | 257/330 |
| 2006/0131647 A1 * | 6/2006 | Meyer | 257/335 |
| 2006/0220093 A1 * | 10/2006 | Van Schaijk et al. | 257/315 |
| 2006/0246650 A1 * | 11/2006 | Williams et al. | 438/212 |
| 2007/0018195 A1 | 1/2007 | Hartner et al. | |
| 2007/0051994 A1 * | 3/2007 | Song et al. | 257/296 |
| 2007/0190728 A1 * | 8/2007 | Sreekantham et al. | 438/270 |

FOREIGN PATENT DOCUMENTS

| | | |
|---|---|---|
| EP | 0 112 489 | 7/1984 |
| EP | 0499403 | 8/2002 |
| EP | 1 353 368 | 10/2003 |
| JP | 63-24672 | 2/1998 |

OTHER PUBLICATIONS

Infineon Technologies, "Deep Trench Isolation (DTI) and Deep Trench Buried Layer Contact (Sinker) for SPTx," pp. 8 (Date Unknown).

Chinese Office Action from the State Intellectual Property Office, P.R. China, Chinese Patent Application No. 200710127113.8, Semiconductor Component and Methods for Producing a Semiconductor Component, Action Issued Mar. 6, 2009.

The Second Chinese Office Action for Chinese Patent Application No. 200710127113.8 dated Aug. 6, 2010 (3 pages).

* cited by examiner

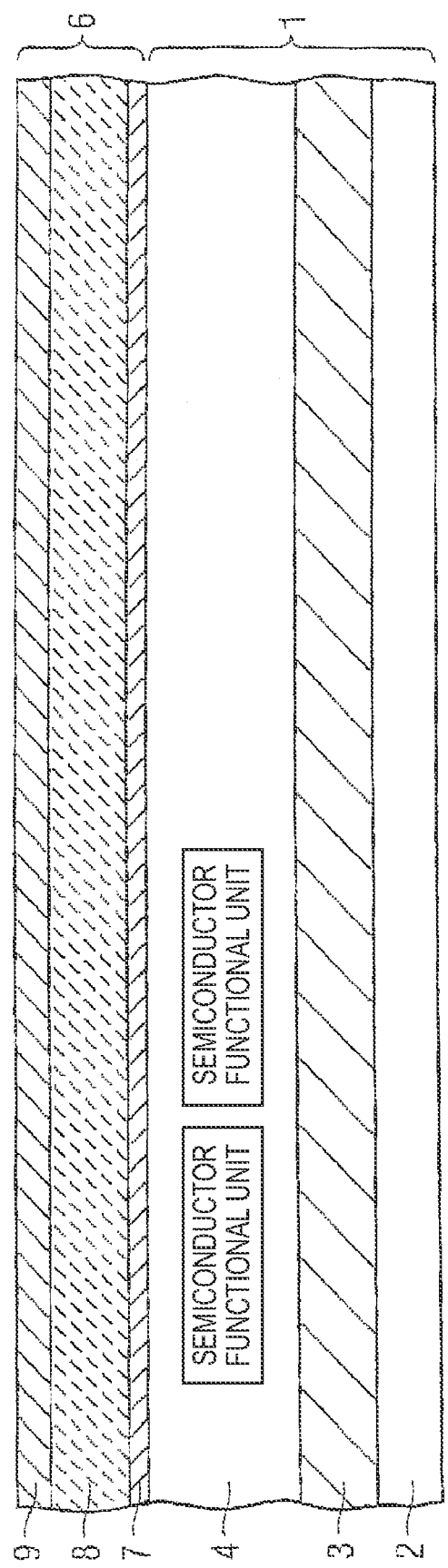

SEMICONDUCTOR COMPONENT INCLUDING AN ISOLATION STRUCTURE AND A CONTACT TO THE SUBSTRATE

BACKGROUND

One aspect of the invention relates to a semiconductor component having a semiconductor body, the semiconductor body including a substrate of a first conduction type, a buried semiconductor layer of a second conduction type arranged on the substrate, a functional unit semiconductor layer of a third conduction type arranged on the buried semiconductor layer, in which at least two semiconductor functional units arranged laterally alongside one another are provided, and a contact from a surface of the semiconductor body to the substrate. The buried semiconductor layer is a part of at least one semiconductor functional unit. The semiconductor functional units are electrically insulated from one another by an isolation structure, which permeates the functional unit semiconductor layer, the buried semiconductor layer and also the substrate.

The lateral space requirement of semiconductor components of the type mentioned in the introduction is relatively large. This stems inter alia from the fact that the isolation structures which permeate the functional unit semiconductor layer, the buried semiconductor layer and also the substrate are produced on the basis of a diffusion process. For example, in order to produce the isolation structures, prior to producing the buried semiconductor layer, dopants are introduced into the upper region of the substrate and, after producing the buried semiconductor layer and the functional unit semiconductor layer, dopants are introduced into the upper region of the functional unit semiconductor layer (above the region of the substrate into which dopants were introduced). Afterward, the two dopant regions are caused to melt by means of a heat treatment process, that is to say that the vertical extents of the dopant regions are enlarged until the latter vertically overlap one another.

An isolation structure produced in this way can be seen in FIG. 1A. A semiconductor body 1 has a substrate 2, a buried semiconductor layer 3 arranged on the substrate 2, and a functional unit semiconductor layer 4 arranged on the buried semiconductor layer 3. The functional unit semiconductor layer 4, the buried semiconductor layer 3 and also the substrate 2 are permeated by an isolation structure 51 (Junction Isolation), which serves for isolating a semiconductor functional unit (not shown) arranged on the left alongside the isolation structure 51 from a semiconductor functional unit (not shown) arranged on the right alongside the isolation structure 51. The conduction type of the functional unit semiconductor layer 4 and of the buried semiconductor layer 3 is of a first conduction type (for example of the n conduction type), whereas the semiconductor material which the isolation structure 51 includes and the substrate 2 are of a second conduction type (for example of the p conduction type). Thus, the isolation structure 51 simultaneously serves as a contact to the substrate 2. The isolation structure 51 has a first isolation structure region $5_1$ and a second isolation structure region $5_2$, which are produced by introducing dopants into the upper region of the substrate 2 and also into the upper region of the functional unit semiconductor layer 4 and a subsequent heat treatment process. The heat treatment process has the effect of enlarging the lateral extent of the isolation structure regions $5_1$, $5_2$, which is undesirable since the resultant lateral space requirement of the semiconductor component is enlarged unnecessarily.

Trench isolations 52 are furthermore known as isolation structures (FIG. 1B). In this case, a trench 11 extending from the surface 41 of the semiconductor component 1 right into the substrate 2 is configured in such a way that it electrically insulates adjacent semiconductor functional units (not shown) in the functional unit semiconductor layer 4 from one another. The trench 11 may be filled with an insulating material (not shown). It is likewise possible to form an insulating layer 12 on the sidewalls and the bottom of the trench 11 and to fill the trench 11 with polysilicon 17, for example, as illustrated in FIG. 1B.

However, the known isolation by means of trenches, as illustrated in FIG. 1B, does not afford a possibility of making contact with the substrate as in the case of diffusion isolation described with reference to FIG. 1A. Therefore, the contact connection to the substrate has to be produced for example by means of an additional diffusion zone or via a rear side contact.

SUMMARY

One embodiment of the invention provides a semiconductor component including an isolation structure and a contact to the substrate. Furthermore, embodiments of the invention provide methods for producing said semiconductor component.

The semiconductor component according to one embodiment of the invention including a semiconductor body, in which are formed a substrate of a first conduction type, a buried semiconductor layer of a second conduction type arranged on the substrate, and a functional unit semiconductor layer of a third conduction type arranged on the buried semiconductor layer, in which at least two semiconductor functional units arranged laterally alongside one another are provided. At least the second or the third conduction type are opposite to the first conduction type. The buried semiconductor layer may be formed on the entire surface of the substrate or only in a few regions of the substrate surface. The buried semiconductor layer is part of at least one semiconductor functional unit (e.g. the buried semiconductor layer may serve as drain zone of a vertical transistor ("buried layer")). The semiconductor functional units are electrically insulated from one another by an isolation structure which permeates the functional unit semiconductor layer, the buried semiconductor layer and also the substrate. The isolation structure includes at least one trench for insulating adjacent semiconductor functional units and an electrically conductive contact to the substrate. The at least one trench electrically insulates the contact to the substrate from the functional unit semiconductor layer and the buried layer.

Si may be used as semiconducting material. Aspects of the invention can be applied to other semiconductor materials provided that suitable material combinations for the insulation and the electrical contact are present.

Furthermore, in one embodiment of the invention it is possible to replace the substrate by an arbitrary semiconductor layer of the first conduction type. Such a semiconductor layer may be for example a second buried semiconductor layer arranged under the first buried semiconductor layer mentioned above. It is likewise possible for the first buried semiconductor layer mentioned above to be contact-connected in an isolated manner by means of the isolation structure described, the latter then reaching only as far as or into the first buried semiconductor layer.

The configuration of the isolation structures as trenches enables the lateral space requirement of the isolation structures largely to be reduced, since nowadays it is possible to produce trenches having very small lateral dimensions. Furthermore, as a result of filling the trenches with electrically conductive material, the electrically conductive material having an electrical contact to the substrate, or as a result of producing a semiconducting zone of the first conduction type between two trenches, the isolation structure may additionally be utilized as electrical contact-connection of the substrate. Such electrical contact-connections of the substrate are customary in semiconductor components of the type described above and require much lateral space in conventional semiconductor components, since they are produced either integrally with the diffused isolation structures (see FIG. 1A) or analogously to the isolation structures of the semiconductor components in accordance with the prior art on the basis of diffusion processes. According to aspects of the invention, it is possible to "combine" isolation structures and substrate contacts in the form of space-saving trenches.

One aspect of the invention furthermore provides a first method for producing the semiconductor component according to a first embodiment of the invention, which method, proceeding from a semiconductor body including
- a substrate of a first conduction type,
- a buried semiconductor layer of a second conduction type provided on the substrate, and
- a functional unit semiconductor layer of a third conduction type provided on the buried semiconductor layer, including:
  - forming at least one trench in the semiconductor body which reaches right into the substrate,
  - forming an isolation layer, which electrically insulates the trench interior from the functional unit semiconductor layer and the buried semiconductor layer but has a cutout at least in the region of the trench bottom, and
  - filling the at least one trench with electrically conductive material.

One aspect of the invention furthermore provides a second method for producing the semiconductor component according to a second embodiment of the invention, which method, proceeding from a semiconductor body including a substrate of a first conduction type, includes:
- forming a buried semiconductor layer on the substrate, the buried semiconductor layer having a region of a second conduction type and at least one region whose conduction type is the first conduction type,
- forming a functional unit semiconductor layer of a third conduction type on the buried semiconductor layer,
- forming at least one trench structure in the semiconductor body, each trench structure, proceeding from the top side of the functional unit semiconductor layer, reaching right into the substrate, and each trench structure comprising two trenches which are laterally spaced apart from one another and between which is situated one of the regions of the first conduction type of the buried semiconductor layer, and
- enlarging the vertical and/or horizontal extent of the regions of the buried semiconductor layer by performing a heat treatment process.

In accordance with one aspect of the second production method, the trenches of each trench structure form a diffusion barrier which prevents, during the diffusion process, dopants from diffusing in the lateral direction beyond a specific limit, rather the dopants are instead "deflected" in a vertical diffusion direction (upward or downward).

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a first process stage of a first embodiment of the first production method according to the invention.

DETAILED DESCRIPTION

Figure 1A:
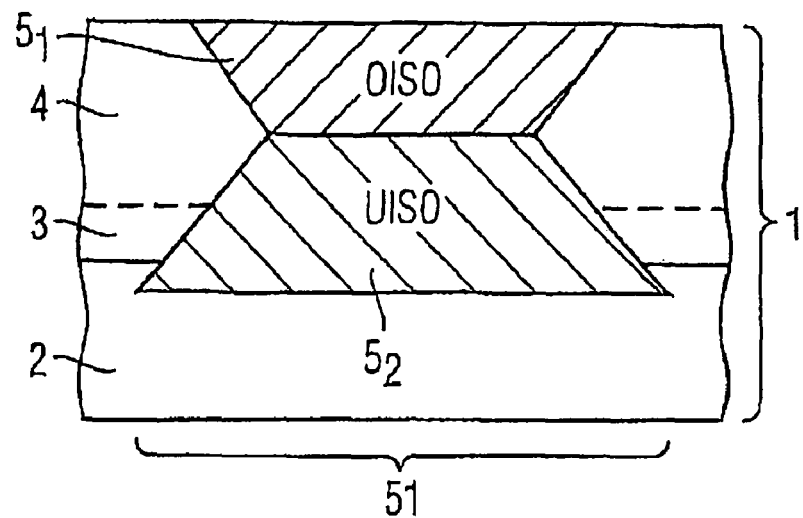
FIG. 1A illustrates a part of a semiconductor component in accordance with the prior art in a cross-sectional illustration.
Figure 1B:
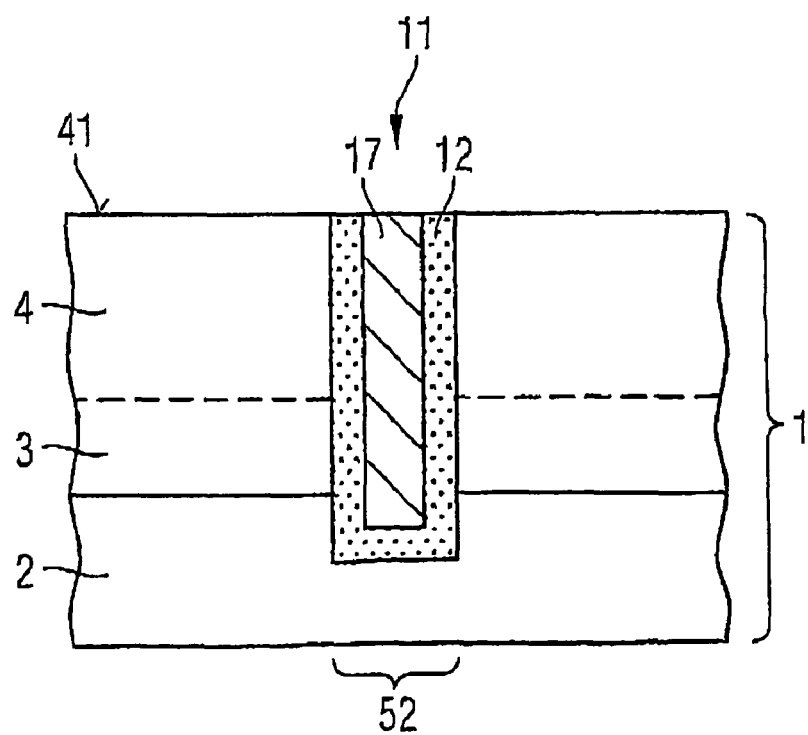
FIG. 1B illustrates a part of another semiconductor component in accordance with the prior art in a cross-sectional illustration.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the figures, identical or mutually corresponding regions, components/component groups are identified by the same reference numerals. Furthermore, all the embodiments may be doped inversely, that is to say that n-type zones are replaced by p-type zones, and vice versa. By way of example, Si is used as semiconducting material in the embodiments illustrated. If corresponding material combinations are present, however, it is also possible to use other semiconducting materials.

In a first embodiment of the invention, the isolation structure includes a trench, the sidewalls of which are at least partly covered with an insulating layer, so that the trench interior is electrically insulated from the functional unit semiconductor layer and the buried semiconductor layer. The interior of the trench is filled with an electrically conductive material which makes electrical contact with the substrate.

In one embodiment of the first embodiment of the invention, the electrically conductive material is a semiconductor material of the first conduction type.

In order to increase the quality of the substrate contact, a part of the substrate which adjoins the electrically conductive material of the first conduction type may have a doping intensity, that is a concentration of dopants, which is higher than the doping intensity of the substrate.

In another embodiment of the first embodiment of the invention, a silicide is formed at least on the bottom of the trench. In the case, that another material than Si is used as semiconductor material, a respective metal-semiconductor compound is formed instead of the silicide. Instead of the silicide, an electrical conductive layer of a semiconductor nitride or a semiconductor carbide may be formed. The electrically conductive material in the trench interior may be a semiconductor material of an arbitrary conduction type.

TiSi, WSi, CoSi, TaSi, HfSi, HfSiOx and other compounds of the semiconductor material with transition metals may be used as the silicide. In an exemplary embodiment, electrically conductive nitrides and carbides like TiN, WN, TaN, TaSiN, TiSiN, WC, TiC and others may be used.

In another embodiment of the first embodiment of the invention, the electrically conductive material is a metal.

W, Al, Cu, Ti, Co, graphite or others as well as electrically conductive silicides, nitrides, and carbides like described above may be used as the metal in this sense. Furthermore, it is possible to combine layers of different materials in order to realize the electrical contact to the substrate.

In a second embodiment of the invention, the isolation structure includes two trenches and also a semiconducting zone of the first conduction type situated between the trenches.

In one embodiment of the second embodiment of the invention, the semiconducting zone of the first conduction type situated between the trenches includes a region of the first conduction type of the buried semiconductor layer and a doped region of the first conduction type above said region of the buried semiconductor layer. The two regions at least partly adjoin one another, so that a continuous semiconducting zone of the first conduction type in the vertical direction is present from the surface of the semiconductor component as far as the substrate.

The trenches of the second embodiment may be filled with an insulating material.

A first embodiment of the first production method according to the invention will be explained in more detail with reference to FIGS. 2 to 9.

FIG. 2 illustrates a semiconductor body 1 having a substrate 2, a buried semiconductor layer 3 arranged on the substrate 2, and a functional unit semiconductor layer 4 arranged on the buried semiconductor layer 3. The functional unit semiconductor layer 4 may be for example an epitaxial, that is to say monocrystalline, layer. The functional unit semiconductor layer 4 contains semiconductor functional units (not shown), for example logic circuits, memory cells or components such as transistors, diodes, capacitors or others. In this case, adjacent functional units must be electrically isolated from one another. In this embodiment, the substrate 2 is lightly doped p-Si, while the buried layer 3 is a highly doped n-Si layer and the functional unit semiconductor layer 4 is a lightly doped n-Si epitaxial layer. The dopings of the substrate and of the semiconducting layers may also be configured differently, but the conduction type of the substrate is opposite to the conduction type of the buried layer 3 and/or the functional unit semiconductor layer 4. A hard mask 6 including a silicon nitride layer 7, an oxide layer 8 and a polysilicon layer 9 is arranged on the functional unit semiconductor layer 4. The hard mask 6 may also include other materials and layer sequences and be adapted to the requirements of the subsequent process steps.

In a second process stage (FIG. 3), a hard mask opening 10 is produced in the hard mask 6, for example using a photomask.

Figure 3:
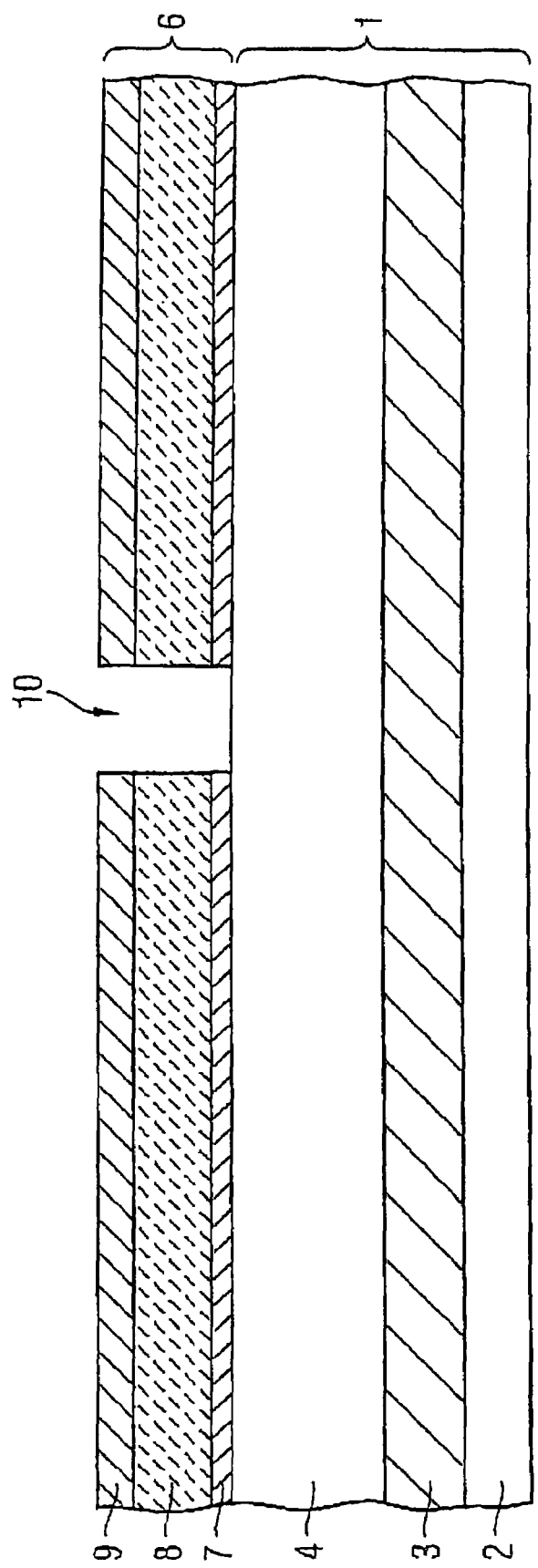
FIG. 3 illustrates a second process stage of the first embodiment of the first production method according to the invention.

In a third process stage (FIG. 4), a trench 11 is produced within the semiconductor body 1 using the hard mask 6 patterned in accordance with FIG. 3, said trench reaching right into the substrate 2. In this case, the trench 11 interrupts the buried semiconductor layer 3. It is also possible for the buried semiconductor layer 3 only to be situated in a region of the semiconductor body 1, that is to say on the one side of the trench 11, if the buried semiconductor layer 3 has been produced only in some regions in the semiconductor body 1 by means of a mask (not illustrated here). During the production of the trench 11, the hard mask 6 is partly removed (polysilicon layer 9 completely, oxide layer 8 partly). The oxide layer 8 is subsequently removed completely, as illustrated in FIG.

4. However, it is also possible for the residual oxide layer 8 not to be removed until in a later process stage.

Figure 4:
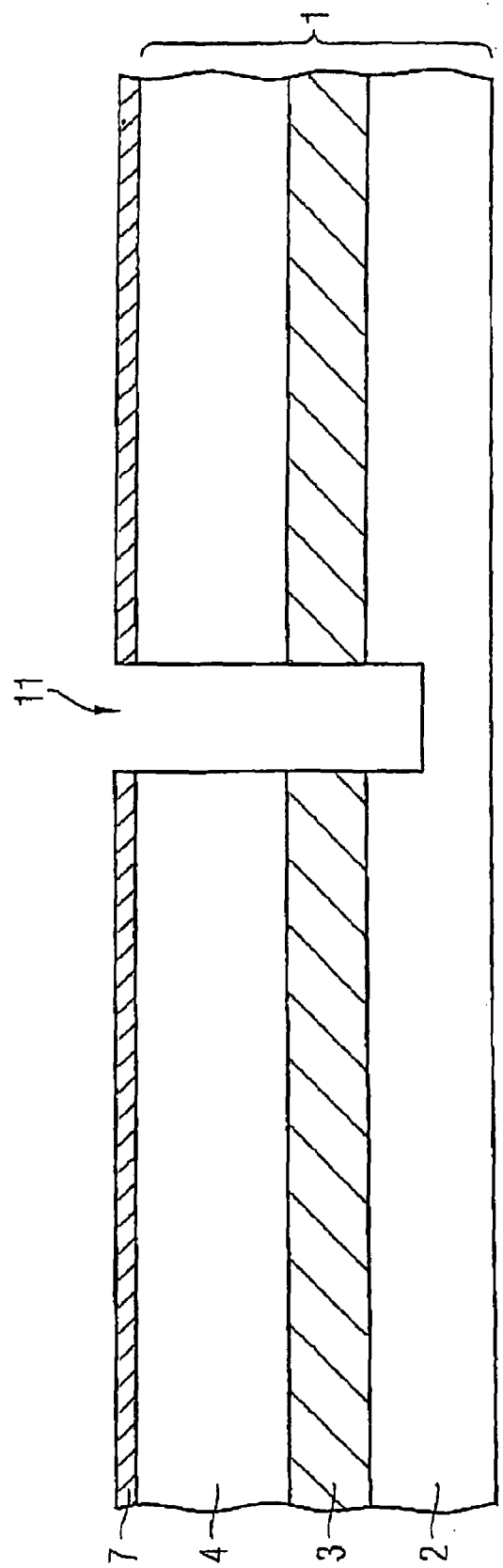
FIG. 4 illustrates a third process stage of the first embodiment of the first production method according to the invention.
Figure 5:
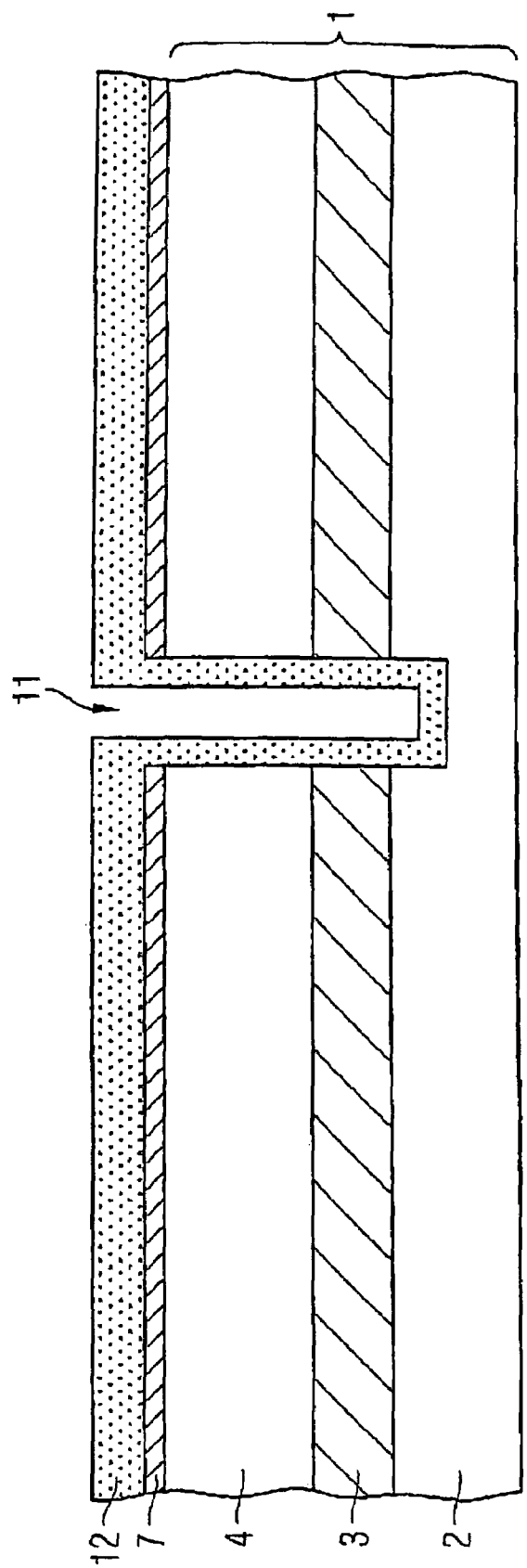
FIG. 5 illustrates a fourth process stage of the first embodiment of the first production method according to the invention.
Figure 6:
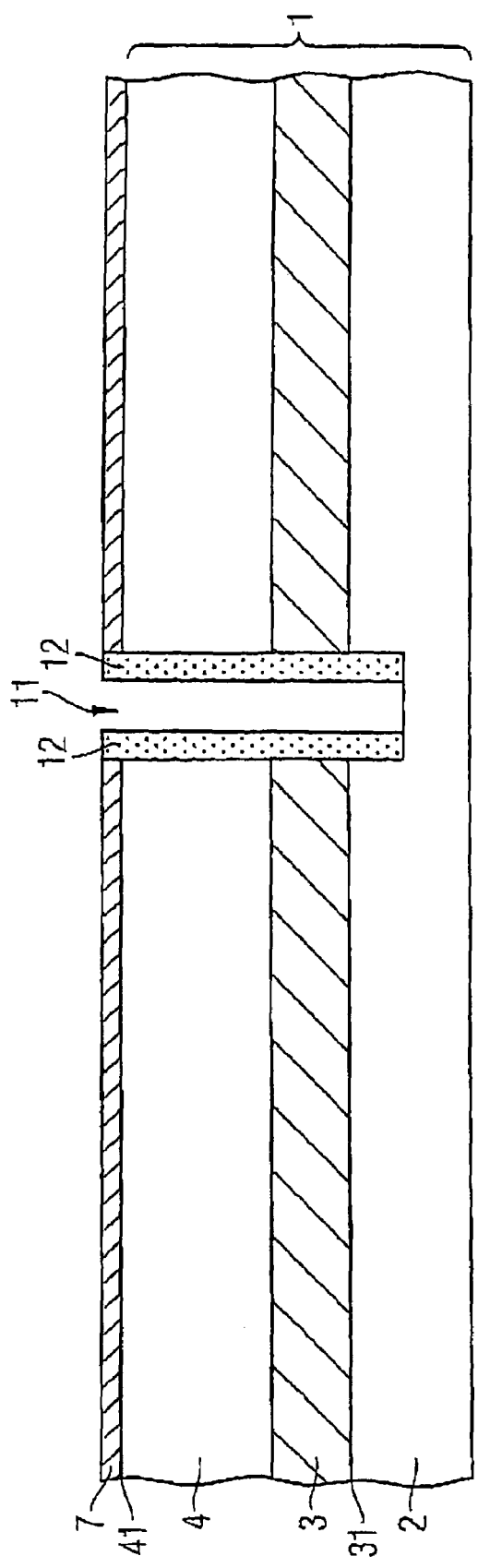
FIG. 6 illustrates a fifth process stage of the first embodiment of the first production method according to the invention.
Figure 7:
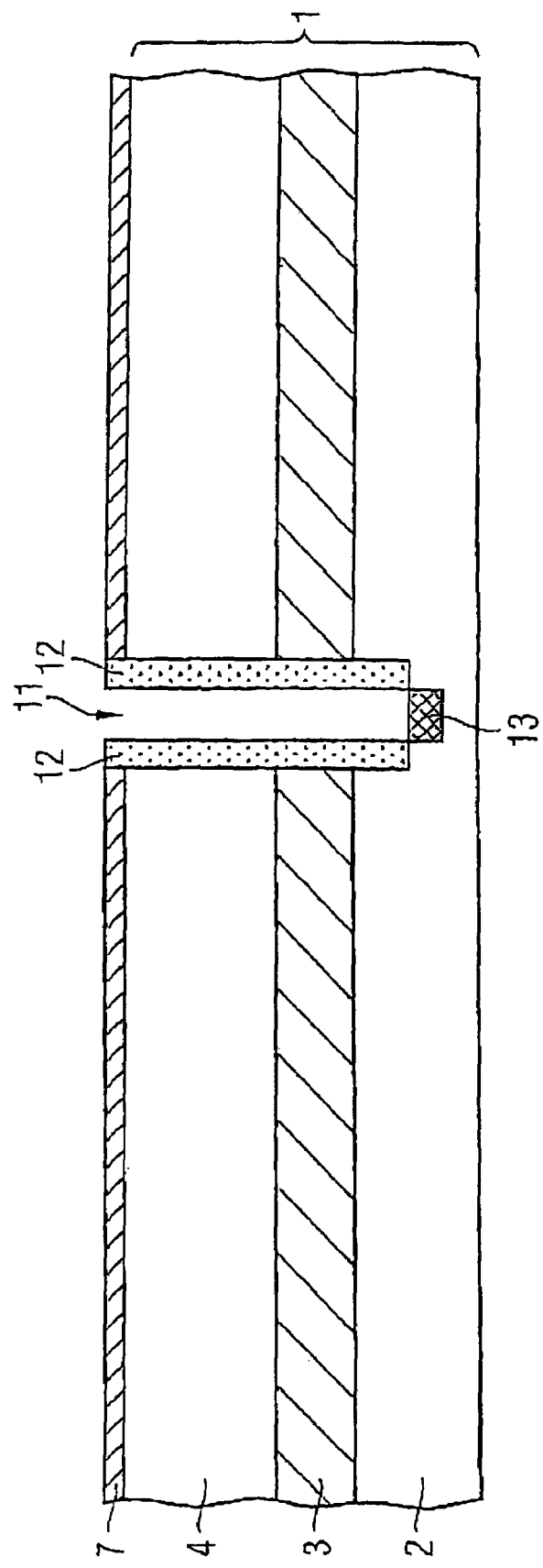
FIG. 7 illustrates a sixth process stage of the first embodiment of the first production method according to the invention.
Figure 8:
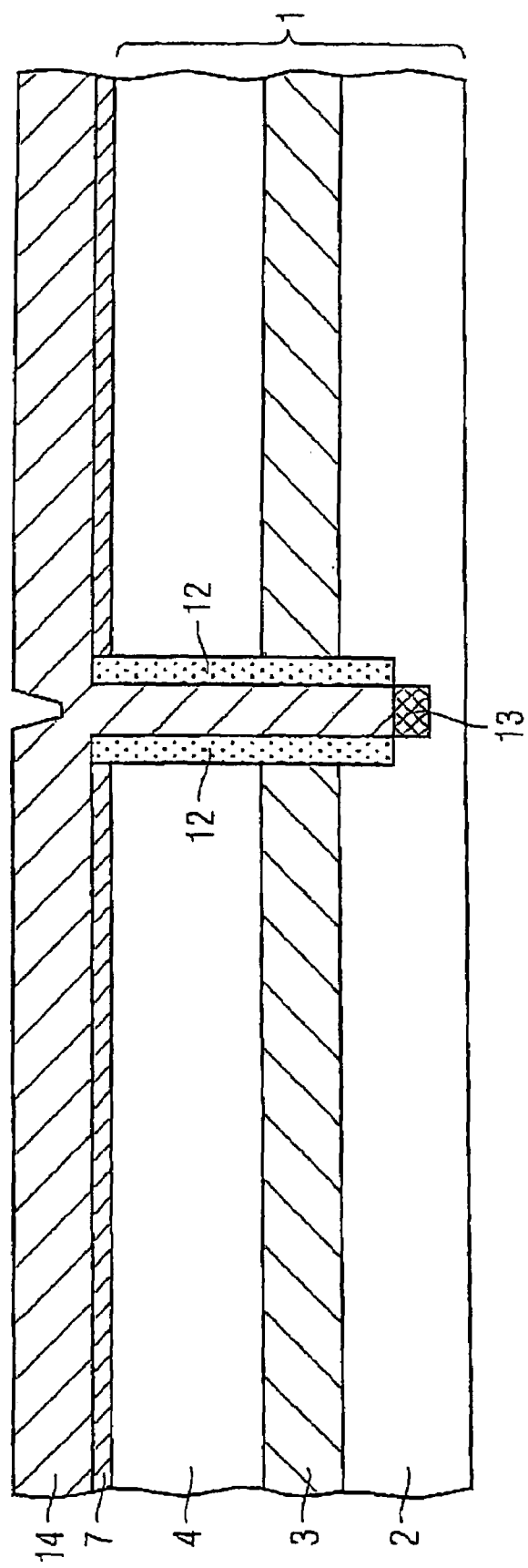
FIG. 8 illustrates a seventh process stage of the first embodiment of the first production method according to the invention.

The trench 11 may have any desired forms and lateral dimensions. However, the form and lateral dimensions must be embodied such that they ensure an electrical isolation of adjacent semiconductor functional units. By way of example, the trench 11 may have a rectangular form in cross section, as illustrated in FIG. 4. In plan view, the trench 11 may for example form a frame around a functional unit, each segment of the frame having a length and an opening width. In this case, the length of a segment results from the length or width of a functional unit to be isolated, while the opening width is determined by the isolation parameters to be ensured.

In a fourth process stage (FIG. 5), an insulation layer 12 is deposited conformally, which covers the surface of the silicon nitride layer 7 and also the inner walls of the trench 11. The insulation layer 12 includes an electrically insulating material, such as for example TEOS, thermal oxide, SiNx, SiOxNy, AlOx, ZrOx, TiOx and others or combinations or layer stacks of electrically insulating materials.

In a fifth process stage (FIG. 6), the insulation layer 12 is removed, for instance by an isotropical etching, in such a way that only the sidewalls of the trench 11 are covered by the insulation layer 12.

The insulation layer 12 must be configured in such a way as to ensure that the functional unit semiconductor layer 4 and the buried layer 3 are electrically insulated from the electrically conductive material introduced later in the interior of the trench 11. By way of example, the insulation layer 12 covers the sidewalls of the trench 11 as far as the bottom of the trench 11. However, it is also possible for the insulation layer 12 to extend from the surface 41 of the functional unit semiconductor layer 4, which forms a surface of the semiconductor body 1, to at least below the lower edge 31 of the buried layer 3. In this case, the lower edge 31 forms the interface between the buried layer 3 and the substrate 2. In other words: it is possible for the insulation layer 12 not to extend as far as the bottom of the trench 11. However, it must always be ensured that a region of the trench 11 which adjoins the substrate is not covered by the insulation layer 12. This may be a region of the trench bottom, as in the embodiments described here, but also a region of the sidewall of the trench 11.

Other methods which do not necessitate removal of the insulation layer 12 from the trench bottom may also be used for producing the insulation layer 12 in the form described.

In one case, lateral opening widths of the trench 11 are 0.5 to 3 μm. In one case, opening widths of trench 11 may lie in the range of 1.5 to 2.5 μm, especially around 2 μm. In one case, depths of the trench 11 are 5 to 50 μm. In other cases, depths of trench 11 may lie in the range of 10 to 25 μm, especially around 20 μm. In one case, thicknesses of the insulation layer 12 are 100 to 700 nm, especially around 100 to 500 nm.

However, all mentioned dimensions and materials may be adjusted to the desired properties of the isolation structure, that are the properties of the electrical insulation and the electrical contact.

Prior to filling the trenches with semiconductor material, dopants of the second conduction type may be introduced into the at least one trench, so that the doping intensity of the region of the substrate which adjoins the trench bottom of the at least one trench is increased with respect to the doping intensity of the substrate.

In a sixth process stage (FIG. 7), dopants of the conduction type of the substrate 2 are introduced into the bottom of the trench 11 for instance by ion implantation, so that a region 13 whose doping concentration is higher than that of the substrate 2 arises within the substrate 2. The electrical connection of the electrically conductive material introduced later into the trench 11 to the substrate 2 can thus be improved. The additional doping step is an optional step; it may also be obviated (omitted).

However, region 13 may be formed in an earlier process stage, for instance as a buried layer. Thus, the lateral dimension of region 13 is not limited by the dimensions of trench 11. In other words, region 13 may extend laterally over trench 11.

Furthermore, it is possible not to form region 13 at all.

In a seventh process stage (FIG. 8), the trench 11 and the surface of the silicon nitride layer 7 are filled and respectively covered with a polysilicon layer 14 of the conduction type of the substrate 2.

In an eighth process step (FIG. 9), the polysilicon layer 14 is etched back so that polysilicon 14 remains only within the trench 11. The trench 11, the sidewalls of which are covered with the insulation layer 12 and the interior of which is filled with the polysilicon 14, and the region 13 thus form a first embodiment of the isolation structure 5 according to the invention.

The silicon nitride layer 7 may remain on the surface 41 of the functional unit semiconductor layer 4 or may be removed therefrom during the further processing of the semiconductor component.

Figure 9:
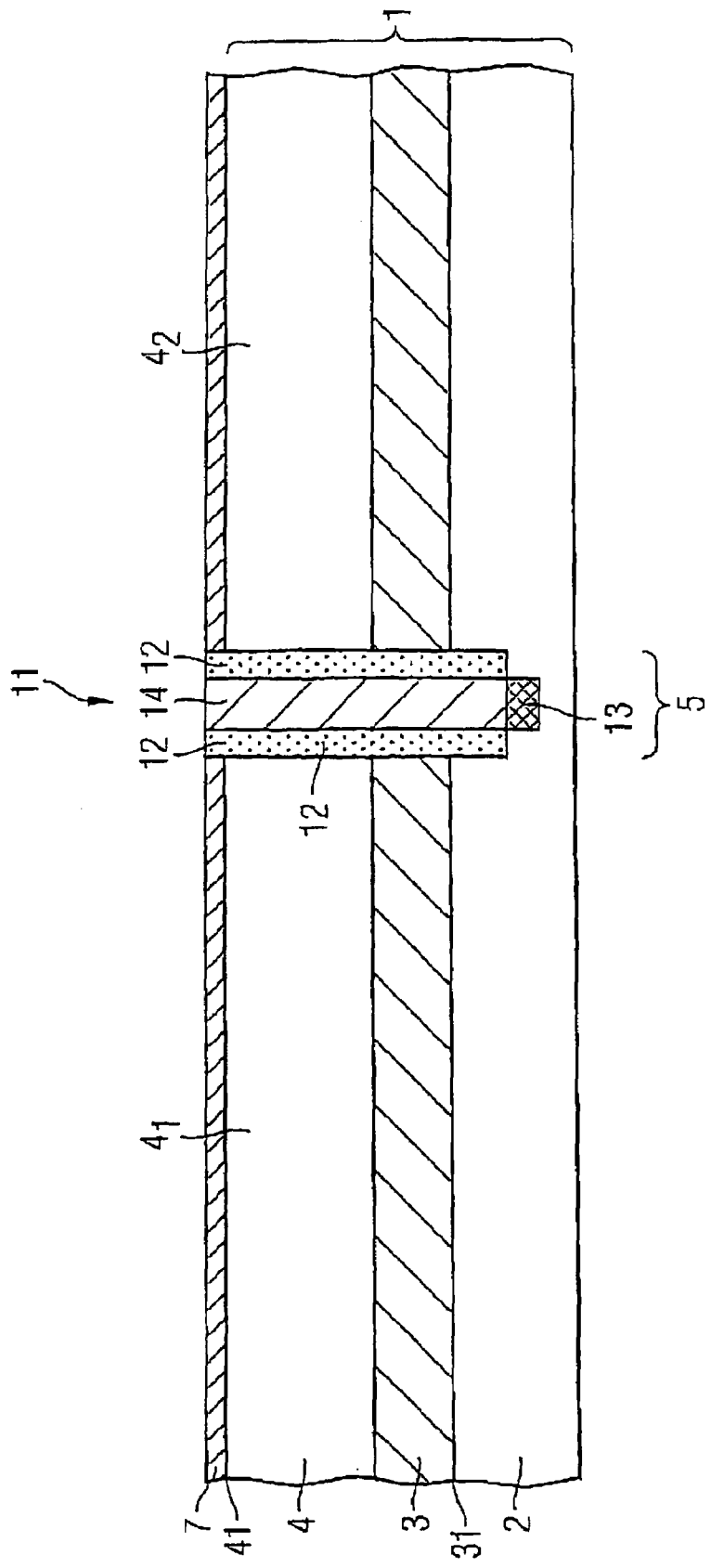
FIG. 9 illustrates an eighth process stage of the first embodiment of the first production method according to the invention.

This results in a first embodiment of the semiconductor component according to the invention, as illustrated in FIG. 9. The semiconductor component includes a semiconductor body 1 and an isolation structure 5. The semiconductor body 1 includes a substrate 2 of a first conduction type, a buried semiconductor layer 3 of a second conduction type and a functional unit semiconductor layer 4 of a third conduction type, at least the second or third conduction type being opposite to the first conduction type. The functional unit semiconductor layer 4 has a surface 41 that does not adjoin the buried semiconductor layer 3. The surface 41 forms a surface of the semiconductor body 1 and of the semiconductor component according to one embodiment of the invention. The isolation structure 5 is formed in a trench 11 which extends from the surface 41 right into the substrate 2 and cuts through the functional unit semiconductor layer 4 and the buried layer 3 in the process. The lower edge of the trench 11 thus has a greater depth, measured from the surface 41, than the lower edge 31 of the buried layer 3. The sidewalls of the trench 11 are covered with an insulating layer 12 extending as far as the bottom of the trench 11. In this case, a region of the trench bottom is not covered by the layer 12. Above said region of the trench bottom, a highly doped region 13 of the first conduction type projects into the substrate 2. Said region 13 improves the contact to the substrate 2. The region 13 is optional, that is to say may also be absent. A polysilicon layer 14 of the first conduction type is situated above the region 13, that is to say in the interior of the trench 11. The layer 14 completely fills the space within the trench 11 between the insulation layers 12 and extends as far as the surface 41. The layer 14 realizes the electrical contact to the substrate 2. The insulation layers 12 realize the electrical isolation of the adjacent regions $4_1$ and $4_2$ of the functional unit semiconductor layer 4 from one another and the electrical isolation of the layer 14 from the functional unit semiconductor layer 4 and also from the buried layer 3.

In another embodiment of the first method, prior to filling the trench interior with an electrically conductive material, a silicide or an electrically conductive nitride or carbide like described above is formed at least on the bottom of the trench.

Afterward, the trench is filled with a semiconductor material of an arbitrary conduction type as the electrically conductive material.

The silicide may be formed by the deposition of a metal at least on the bottom of the trench. In this case, a silicide arises in the regions in which the metal directly makes contact with a semiconducting material (for example silicon).

Ti, W, Co, Ta, Hf, and other transition metals may be used as the metal for forming the silicide.

In the description below, a second embodiment of the first production method according to the invention will be explained with reference to FIGS. 10 to 13.

Figure 10:
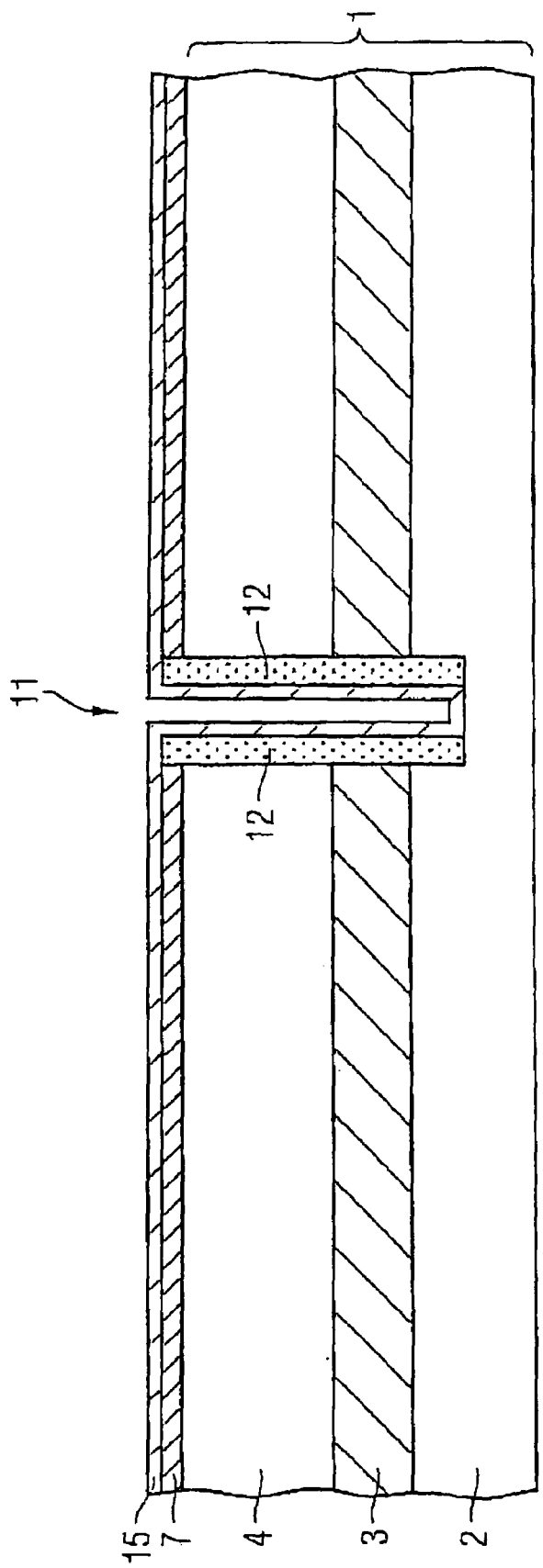
FIG. 10 illustrates a sixth process stage of a second embodiment of the first production method according to the invention.

After the production of a trench 11 in the semiconductor body 1 and the production of an insulation layer 12 on the sidewalls of the trench 11, as has been described with reference to FIGS. 2 to 6, a metallic layer 15 is deposited conformally on the silicon nitride layer 7 and on the surface of the trench 11 (FIG. 10). The layer 15 is thus situated on the insulation layer 12 on the sidewalls of the trench 11 and also on the bottom of the trench 11.

Figure 11:
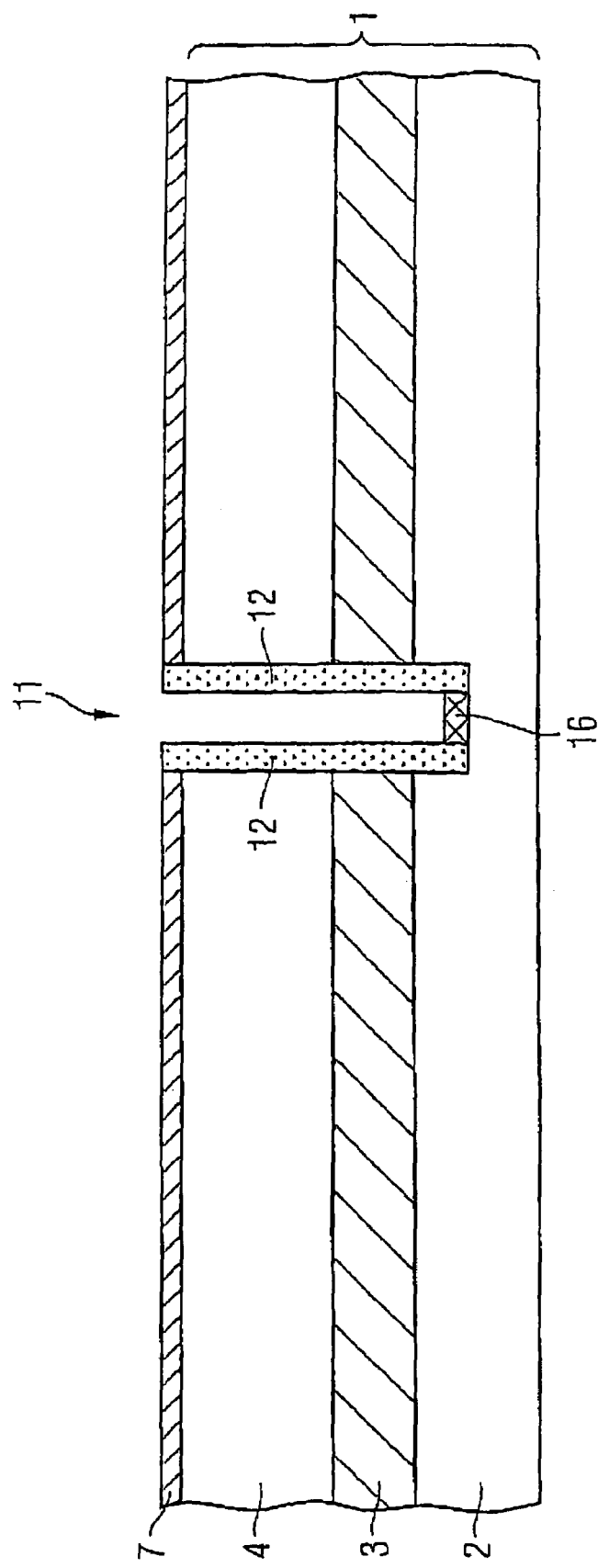
FIG. 11 illustrates a seventh process stage of the second embodiment of the first production method according to the invention.

In a subsequent siliciding step, a silicide is produced at the locations at which the layer 15 makes contact with the silicon. As illustrated in FIG. 11, this gives rise to a silicide 16 at the bottom of the trench 11. Afterward, the metallic layer 15 is removed, giving rise to the structure illustrated in FIG. 11.

The silicide 16 on the bottom of the trench 11 may also be produced in a different way, for example by means of a CVD deposition, in which case further process steps, such as the removal of unrequired layer regions for example, may then become necessary. Exemplary, other electrically conductive layers 16, like for instance nitrides or carbides, may be formed instead of silicide 16.

Figure 12:
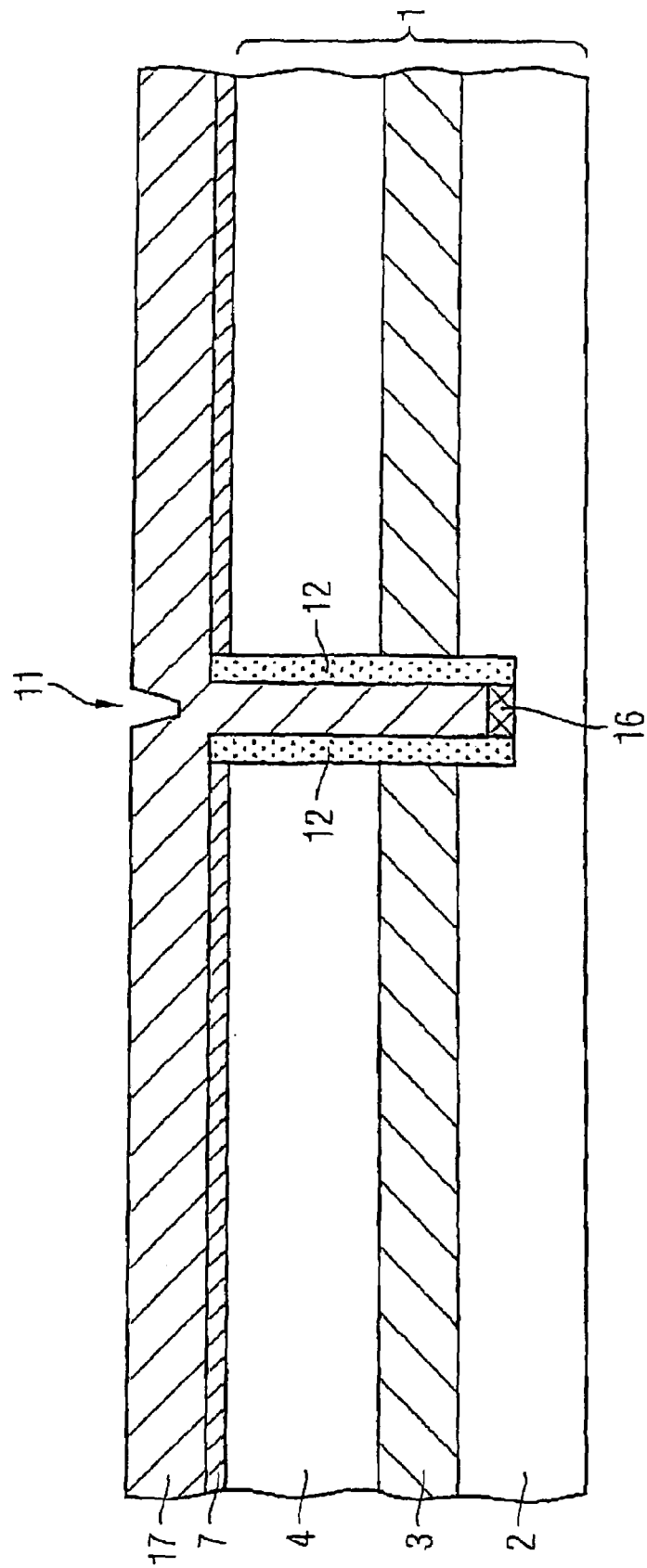
FIG. 12 illustrates an eighth process stage of the second embodiment of the first production method according to the invention.

In an eighth process stage of the second embodiment of the first production method, a polysilicon layer 17 is deposited in such a way that it completely fills the remaining trench 11 and covers the surface of the silicon nitride layer 7 (FIG. 12). In this case, the polysilicon layer 17 may be of an arbitrary conduction type.

Figure 13:
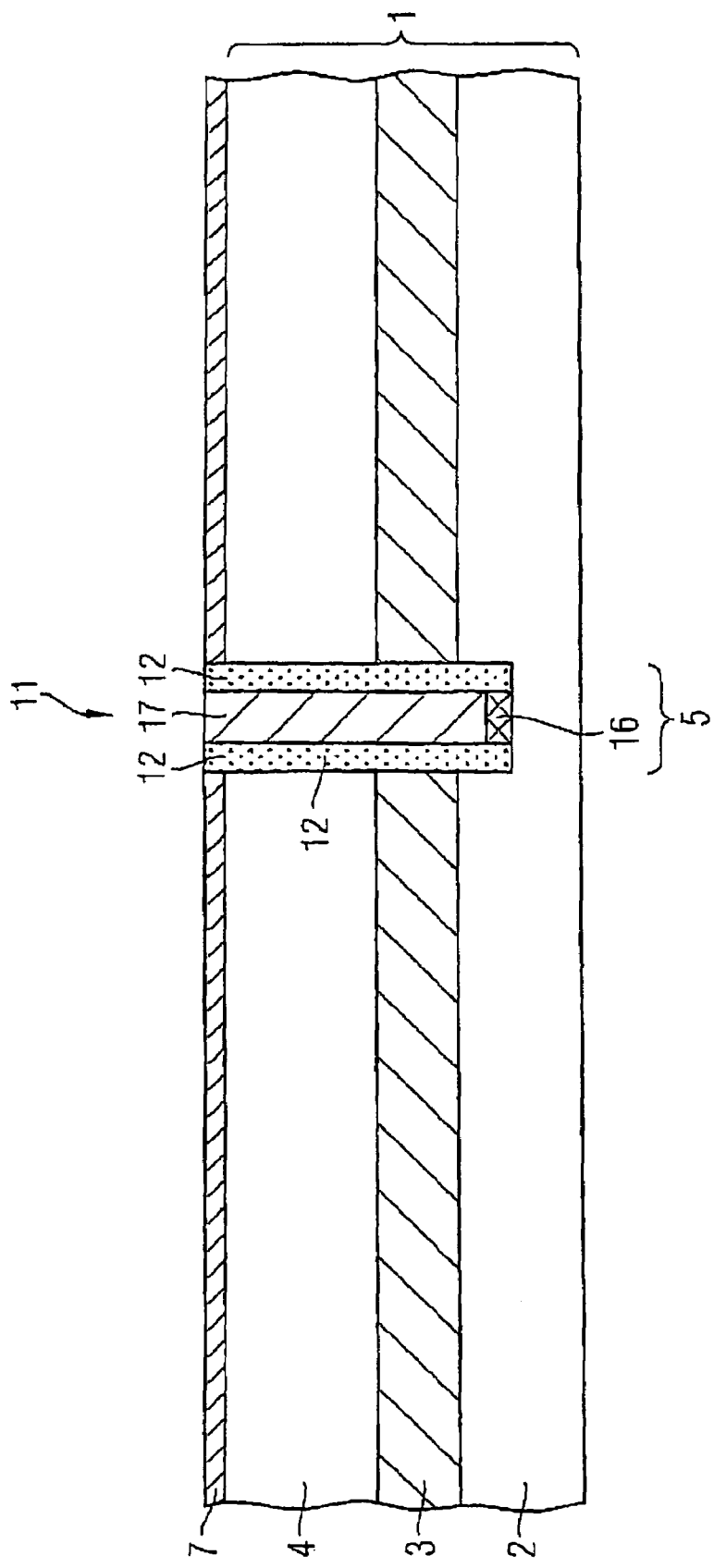
FIG. 13 illustrates a ninth process stage of the second embodiment of the first production method according to the invention.

In a ninth process stage, the polysilicon layer 17 is removed from the surface of the silicon nitride layer 7 (FIG. 13). Thus, the trench 11, the sidewalls of which are covered with the insulation layer 12 and the interior of which is filled with the polysilicon 17, forms a second embodiment of the isolation structure 5 according to the invention.

The second embodiment of the semiconductor component according to the invention as illustrated in FIG. 13 is similar to the first embodiment illustrated in FIG. 9. However, there is no highly doped region 13 situated in the substrate 2, rather a silicide 16 is formed on the bottom of the trench 11. The silicide 16 may also project into the substrate 2. The space within the trench 11 between the insulation layers 12 is completely filled with a polysilicon layer 17 of an arbitrary conduction type.

The second embodiment provides the arbitrarily selectable conduction type of the polysilicon layer 17. It is thus possible to obviate process steps such as, by way of example, the deposition of a further polysilicon layer having an opposite conduction type, when making contact with semiconducting layers having an opposite conduction type in different regions of a semiconductor body.

In one embodiment of the first method, the trench is filled with a metallic layer.

W, Al, Cu, Ti, Co, graphite, and others as well as electrically conductive metal-semiconductor compounds, nitrides or carbides like described above may be used as the metal in this sense.

In the description below, a third embodiment of the first production method according to the invention will be explained with reference to FIGS. 14 and 15.

Figure 14:
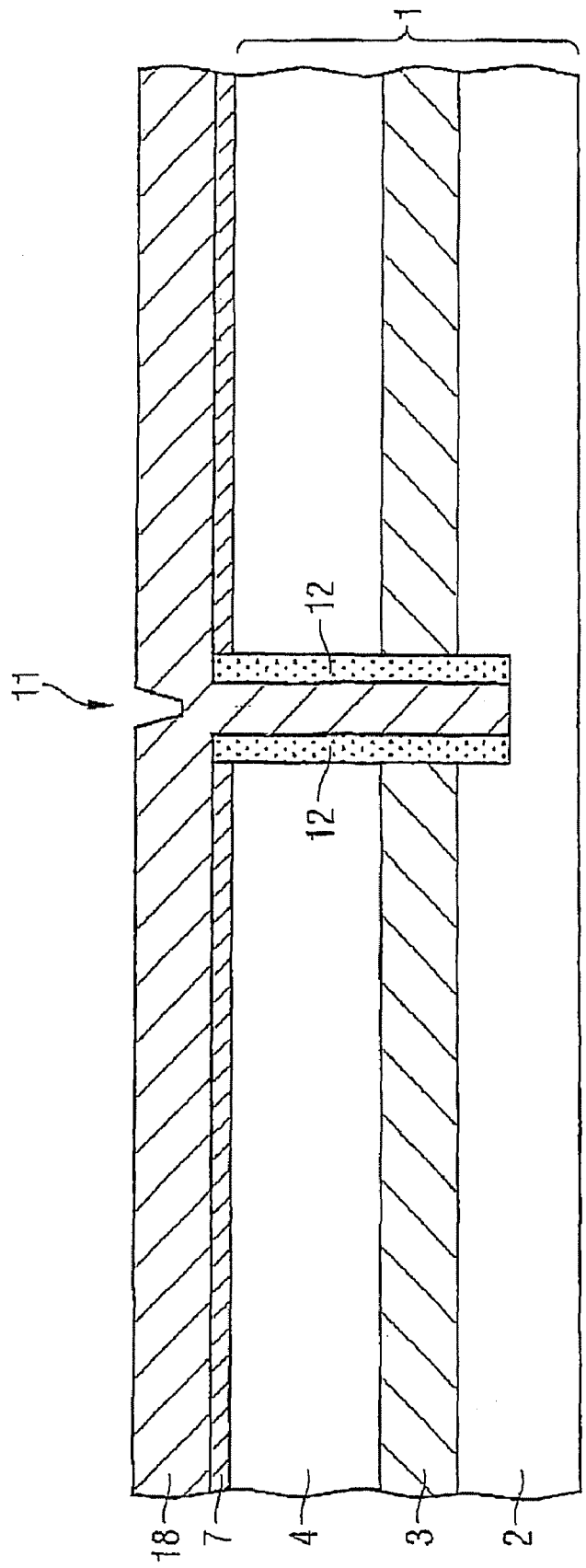
FIG. 14 illustrates a sixth process stage of a third embodiment of the first production method according to the invention.

After the production of a trench 11 in the semiconductor body 1 and the production of an insulation layer 12 on the sidewalls of the trench 11, as has been described with reference to FIGS. 2 to 6, a layer 18 is deposited on the silicon nitride layer 7 and in the trench 11 (FIG. 14). The layer 18 thus completely fills the trench 11. The layer 18 is a metallic layer. Possible materials of the layer 18 may be graphite, electrically conductive nitrides or carbides, or metals such as W, Cu, Al, Ti, Co, or others. Depending on the material chosen, it may be necessary to deposit an electrically conductive barrier layer (not illustrated) on uncovered semiconductor regions before the deposition of the layer 18. Furthermore, layer 18 may include a compound or a layer stack of mentioned materials.

Figure 15:
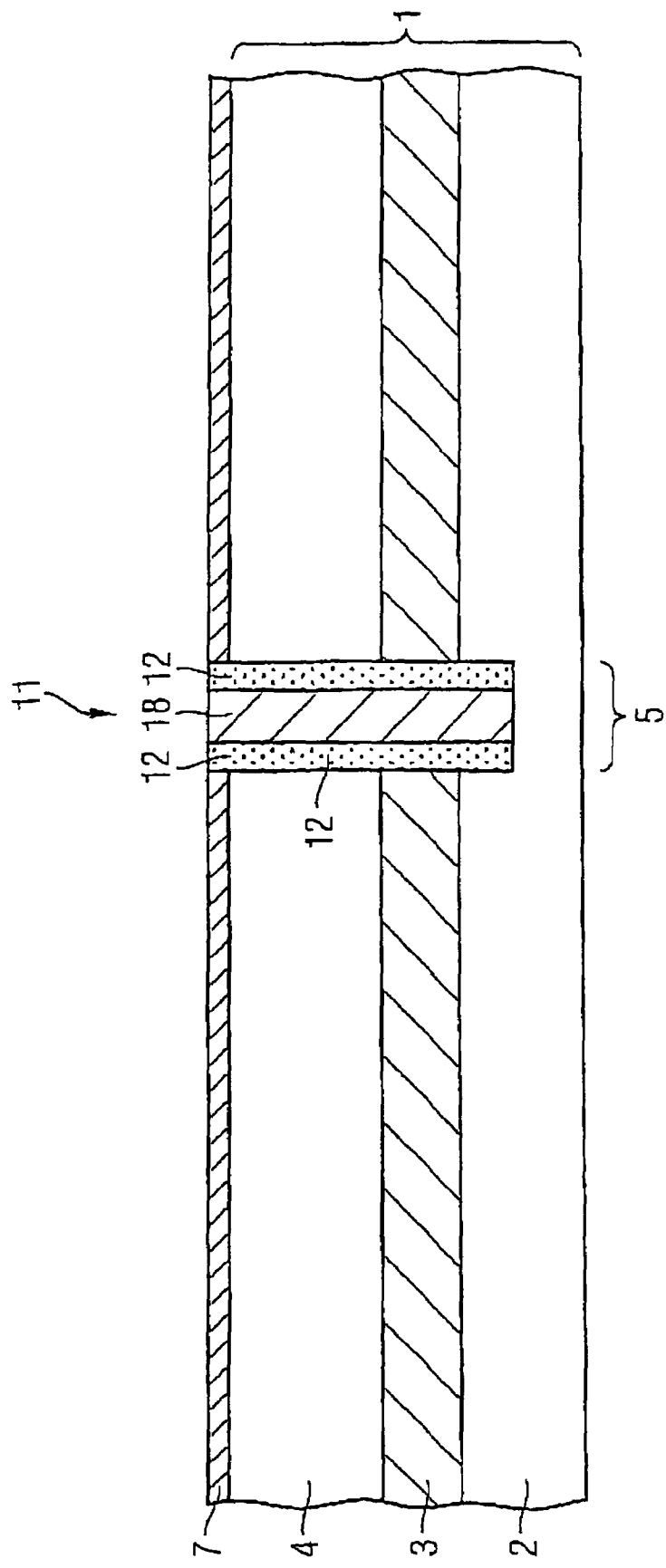
FIG. 15 illustrates a seventh process stage of the third embodiment of the first production method according to the invention.
Figure 16:
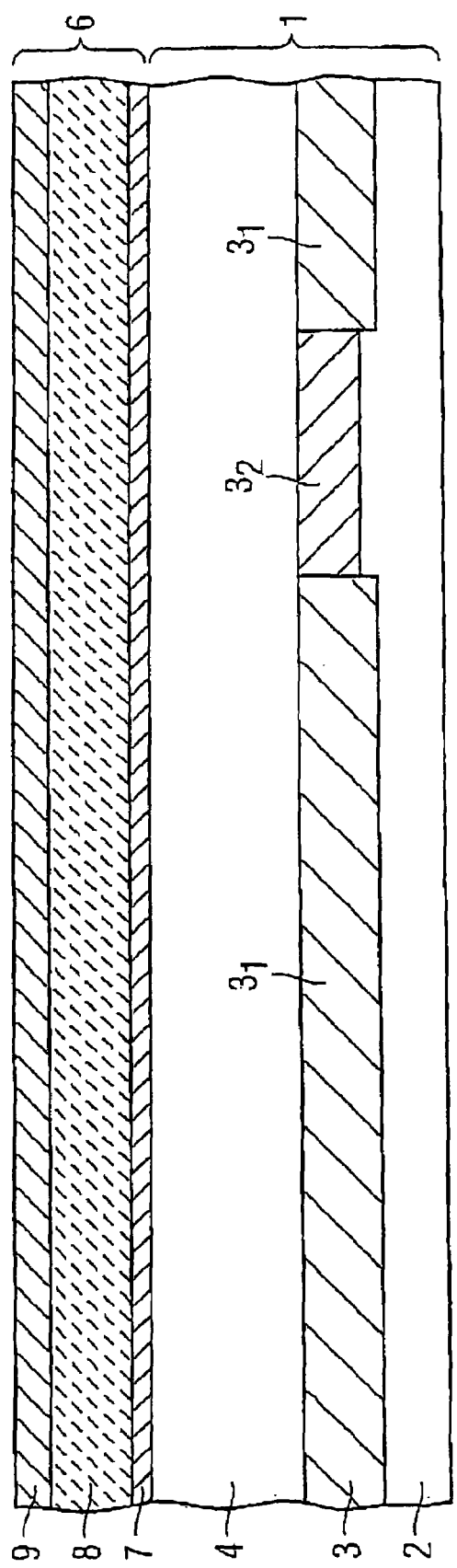
FIG. 16 illustrates a first process stage of a first embodiment of the second production method according to the invention.
Figure 17:
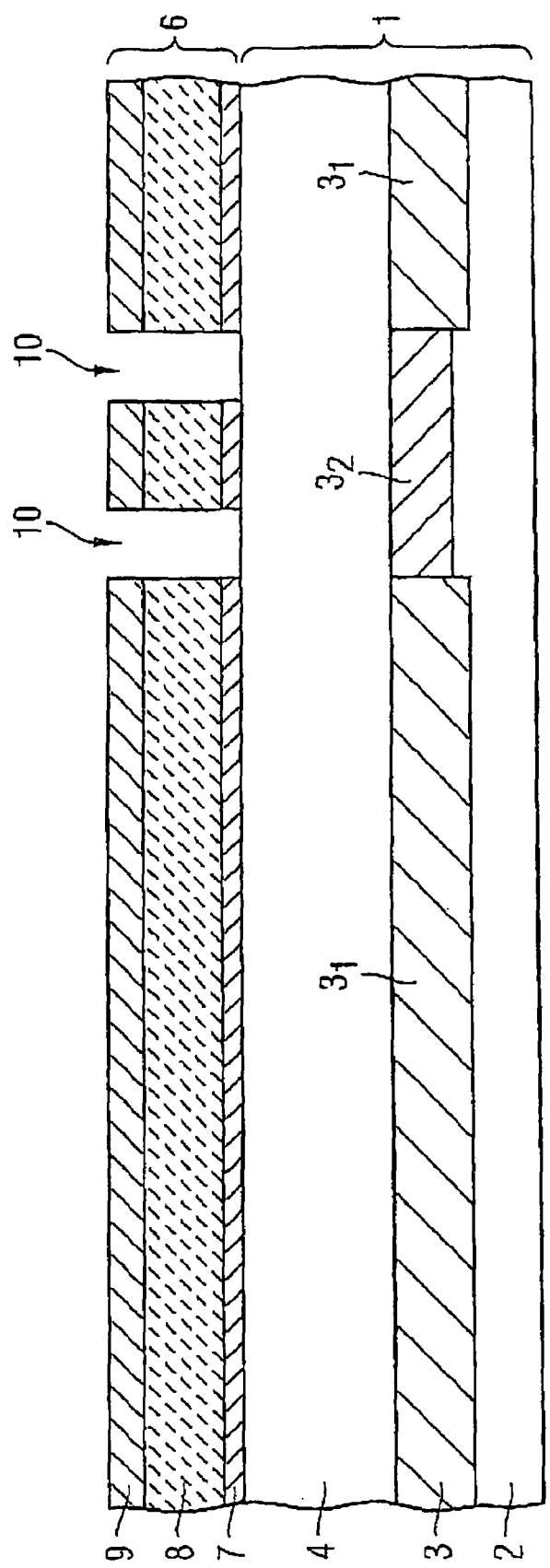
FIG. 17 illustrates a second process stage of the first embodiment of the second production method according to the invention.
Figure 18:
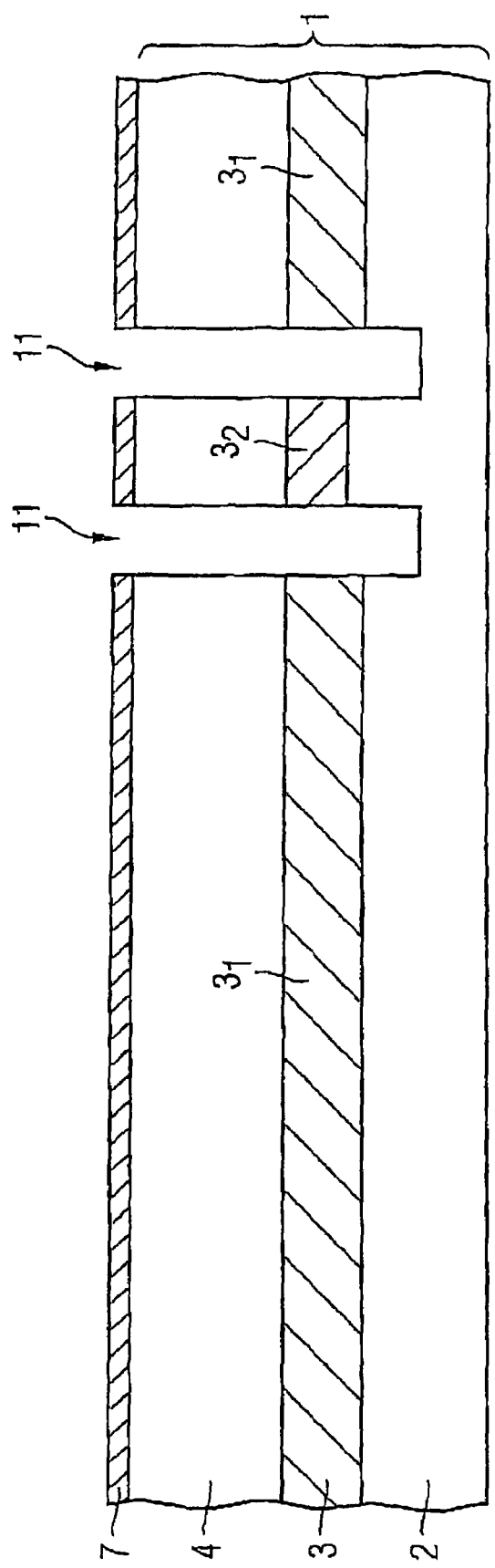
FIG. 18 illustrates a third process stage of the first embodiment of the second production method according to the invention.
Figure 19:
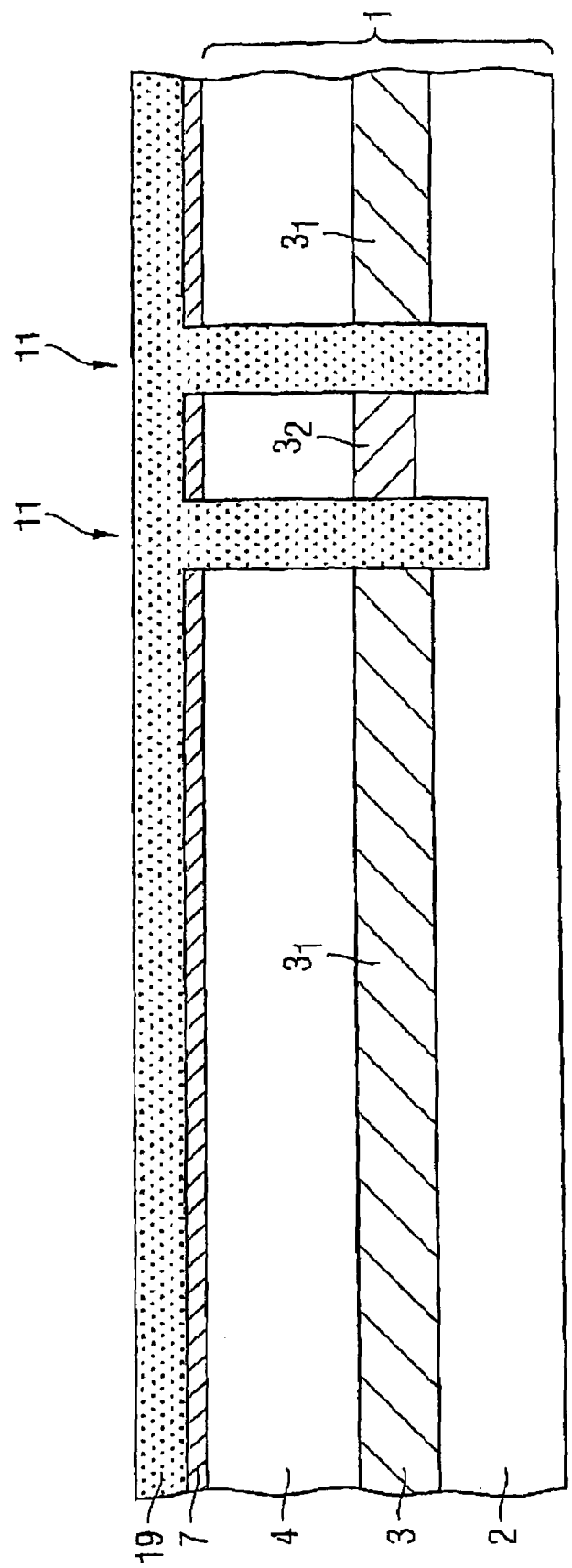
FIG. 19 illustrates a fourth process stage of the first embodiment of the second production method according to the invention.
Figure 20:
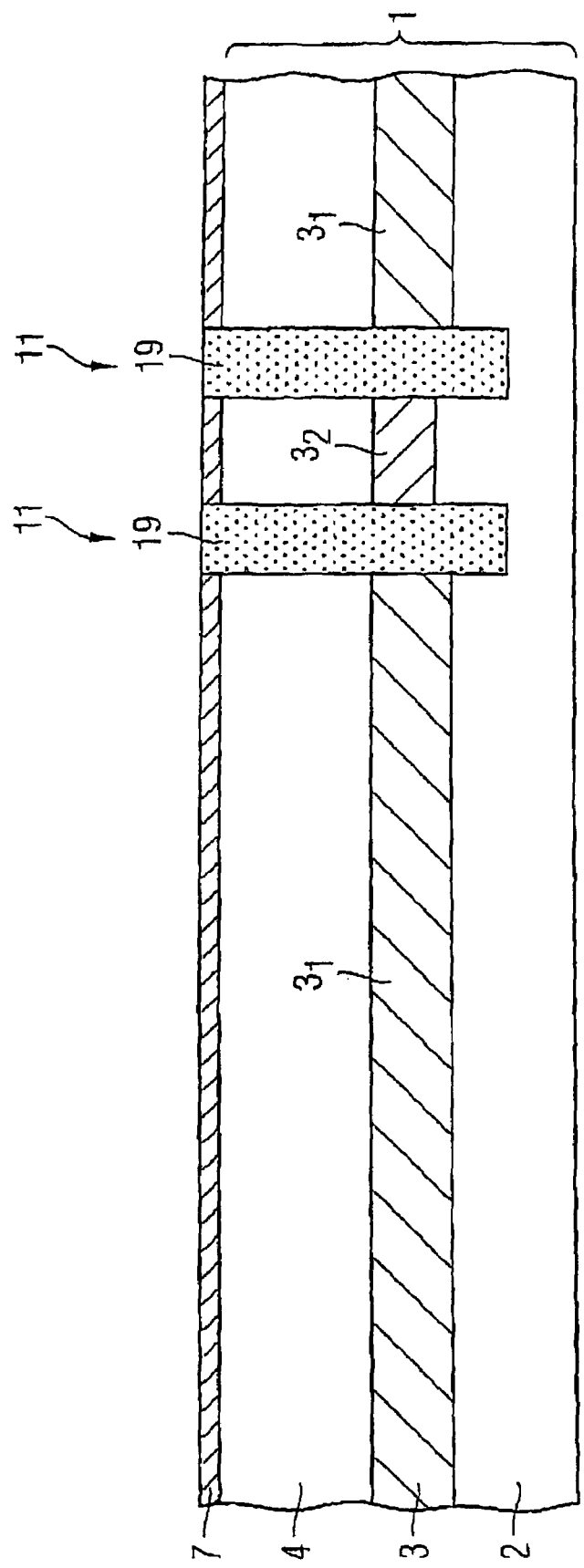
FIG. 20 illustrates a fifth process stage of the first embodiment of the second production method according to the invention.

In a seventh process stage of the third embodiment of the first production method according to the invention, the layer 18 is removed from the surface of the silicon nitride layer 7 (FIG. 15). The trench 11, the sidewalls of which are covered with the insulation layer 12 and the interior of which is filled with the layer 18, thus forms a third embodiment of the insulation structure 5 according to the invention.

The third embodiment of the semiconductor component according to the invention as illustrated in FIG. 15 is similar to the first embodiment illustrated in FIG. 9. However, there is no highly doped region 13 situated in the substrate 2. The space within the trench 11 between the insulation layers 12 is completely filled with a metallic layer 18.

The third embodiment provides a free choice of the material of the layer 18 independently of the conduction type of the substrate. It is thus possible to make contact with semiconducting layers having the opposite conduction type in different regions of a semiconductor body by means of only one deposition of a conductive material.

In one embodiment of the second production method according to the invention, as a result of the formation of the trenches, the lateral extents of the regions of the first doping type of the buried semiconductor layer are decreased by virtue of the lateral positions of the regions of the buried semiconductor layer and the lateral positions of the trenches overlapping one another. In other words: as a result of the formation of the trenches, the edge zones of these regions are "clipped"; this restricts still further the lateral degrees of freedom during the diffusion process.

In order to produce a continuous zone of the first conduction type in the vertical direction between the surface of the semiconductor component and the substrate, it is possible, by introducing dopants into the region between the trenches, to produce a region of the first conduction type above the region of the first conduction type of the buried layer. In some embodiments, this is advantageous if the vertical extent of the functional semiconductor layer is so large that it is not possible, just by outdiffusion of dopants from the region of the first conduction type of the buried layer, to achieve a sufficiently high doping of the zone between the trenches through to the surface of the semiconductor component. It may necessary to additionally introduce dopants of the first conduction type from the surface of the semiconductor component, for example by means of implantation via a mask, if the third conduction type, that is to say the conduction type of the functional unit semiconductor layer, is opposite to the first conduction type.

The trenches may be filled with insulating material

In the description below, a first embodiment of a second production method according to the invention will be explained with reference to FIGS. 16 to 22.

In a first process stage (FIG. 16), a semiconductor body 1 is provided, including a substrate 2, a buried semiconductor layer 3 and a functional unit semiconductor layer 4. In this embodiment, the substrate 2 is lightly doped p-Si, while the functional unit semiconductor layer 4 is a lightly doped n-Si epitaxial layer. The buried semiconductor layer 3 includes regions $3_1$ of the second conduction type (here: n conduction type) and also regions $3_2$ of the first conduction type (conduction type of the substrate, here: p conduction type). The dopings of the substrate and of the semiconducting layers may also be configured differently, but the conduction type of the substrate is opposite to the conduction type of the buried layer regions $3_1$ and the functional unit semiconductor layer 4. In order to produce the buried semiconductor layer 3, it is possible, by way of example, in a first step, to deposit a continuous n-doped semiconductor layer on the substrate 2 and, in a second step, by means of a suitable masking, to remove a part of the n-doped semiconductor layer and subsequently to fill the removed region with p-doped semiconductor material. A functional unit semiconductor layer 4 is then produced on the semiconductor layer 3 produced in this way, so that the semiconductor layer 3 becomes a buried semiconductor layer 3. A hard mask 6 including a silicon nitride layer 7, a oxide layer 8 and a polysilicon layer 9 is arranged on the semiconductor body 1.

In a second process stage (FIG. 17), hard mask openings 10 are introduced in the hard mask 6, the lateral position of said openings overlapping the lateral position of the p-doped region $3_2$. In other words: the lateral position of the left-hand interface of the region $3_2$ with respect to the left-hand region $3_1$ must be situated below the left-hand hard mask opening 10, while the lateral position of the right-hand interface of the region $3_2$ with respect to the right-hand region $3_1$ must be situated below the right-hand hard mask opening 10.

In a third process stage (FIG. 18), trenches 11 are produced in the semiconductor body 1 using the hard mask 6 as an etching mask, said trenches reaching right into the substrate 2. Thus, the trenches 11 separate the regions $3_1$ from the region $3_2$ of the buried semiconductor layer 3.

In a fourth process stage (FIG. 19), insulating material 19, for example TEOS, is deposited on the surface of the silicon nitride layer 7 and into the trenches 11, so that the trenches 11 are completely filled with the insulating material 19.

In a fifth process stage (FIG. 20), the insulating material 19 is etched back in such a way that insulating material 19 remains only within the trenches 11.

In a sixth process stage (FIG. 21), the silicon nitride layer 7 is removed and a heat treatment process is carried out. Silicon nitride layer 7 also may remain on surface 41. The heat treatment process results in an enlargement of the vertical extent of the regions $3_1$ and of the region $3_2$ of the buried semiconductor layer 3. On account of the fact that the region $3_2$ is laterally enclosed by the insulating material 19 within the trenches 11, the effect of the vertical extent of this region can be increased in a targeted manner, the effect being all the greater the closer the two trenches 11 are to one another, that is to say the narrower the interspace between the two trenches 11. The trenches 11 accordingly act as a lateral diffusion barrier, which has the effect that the vertical extent of the region $3_2$ turns out to be higher compared with the regions $3_1$, which have no lateral diffusion barrier.

In a seventh process stage (FIG. 22), dopants of the second conduction type (p conduction type) are introduced into the upper region between the trenches 11 into which no dopants could penetrate from the region $3_2$ during the diffusion process, so that a p-doped region 20 arises. Region 20 forms, together with the region $3_2$, proceeding from the surface 41 of the functional unit semiconductor layer 4, a continuous region 21 of the first conduction type, thereby enabling an electrical contact to the substrate 2. The totality of the trenches 11 filled with insulating material 19 and the regions 20 and $3_2$ may be interpreted as a fourth embodiment of the isolation structure 5. The isolation structure 5 serves on the one hand for insulating different semiconductor functional units (not shown) which have been or are formed in the regions $4_1$ and $4_2$; at the same time, region 21 of the first conduction type situated between the trenches 11 may be used for making contact to the substrate 2. The lateral space requirement of the semiconductor component can be greatly reduced in this way.

Typical lateral opening widths for the trenches 11 are similar to that mentioned with respect to the first production method. Typical lateral distances between the trenches 11 of an isolation structure 5, that is to say the lateral width of the zone 21, are 1 to 500 μm.

Figure 21:
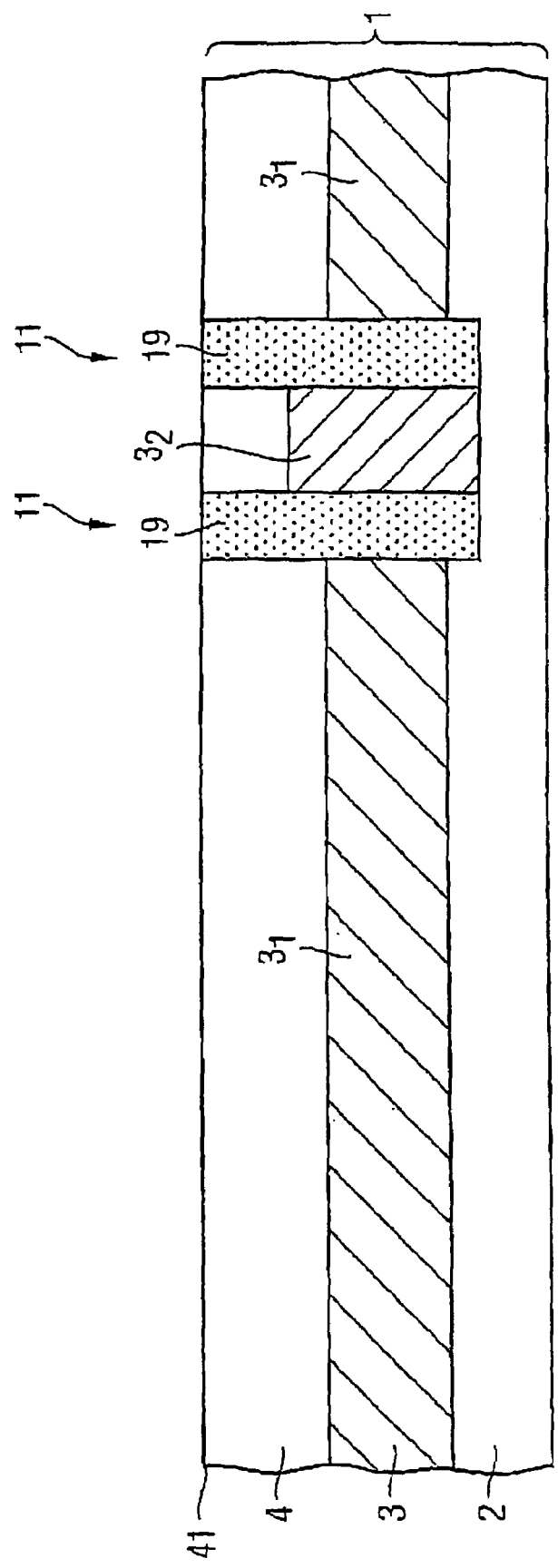
FIG. 21 illustrates a sixth process stage of the first embodiment of the second production method according to the invention.
Figure 22:
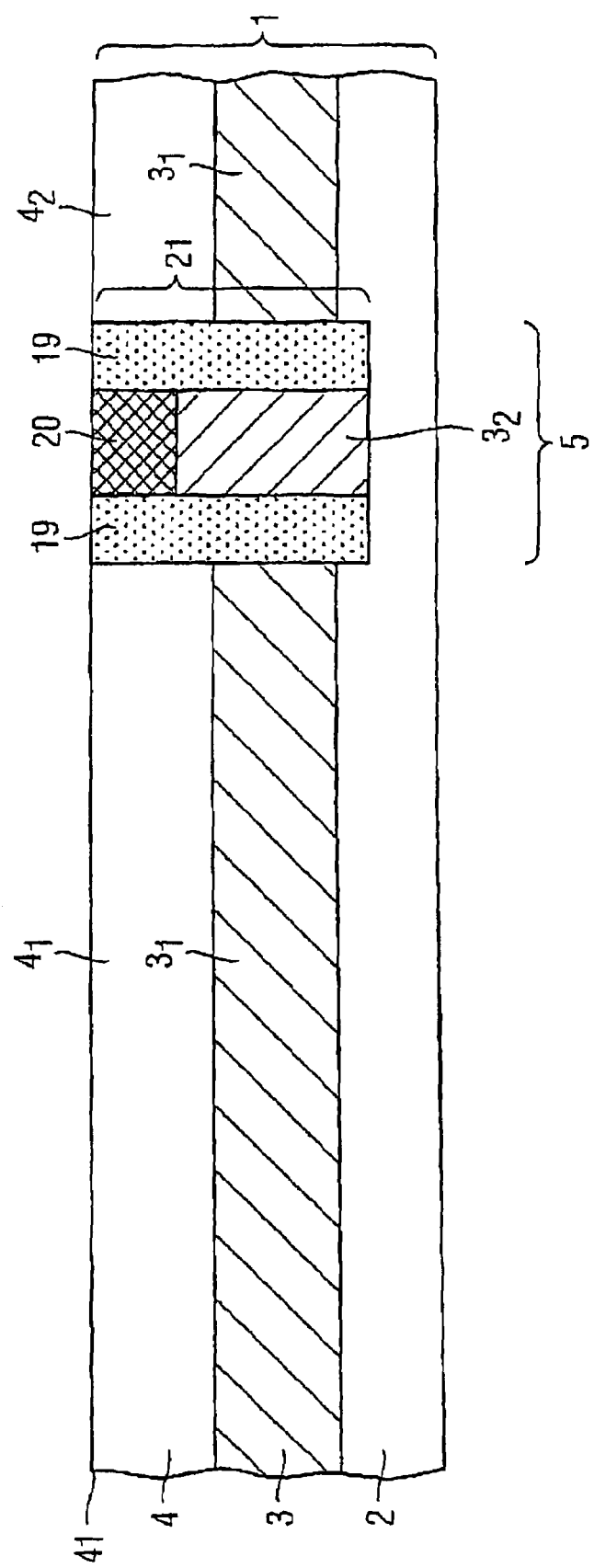
FIG. 22 illustrates a seventh process stage of the first embodiment of the second production method according to the invention.

For the case where the region $3_2$ reaches the surface 42 of the functional unit semiconductor layer 4 during the heat treatment process described with reference to FIG. 21, and the doping intensity of the resulting zone 21 of the first conduction type suffices for a low-impedance contact to the substrate 2, the formation of the highly doped region 20 may be obviated.

Further aspects of the invention will be explained in the description below.

In the SPT products (Smart Power Technologies) which are commonly available nowadays and combine the functionality of CMOS, bipolar and DMOS devices on one chip, the isolation of the various circuit elements on the Si chip is realized by a diffusion isolation. This involves producing a p-doped zone on an n-type substrate or an n-type epitaxial layer e.g. by means of masked implantation and subsequent heat treatment. A similar procedure is used for producing an electrical contact to the buried layer. This involves producing a highly doped n$^+$-type zone on the wafer surface by masked coating with a highly doped phosphorus glass. The dopants are subsequently "driven" into the substrate or into the epitaxial layer by heat treatment.

A contact to the substrate is also required besides a contact to the buried layer. This substrate contact, which simultaneously represents the junction isolation of the wells, is realized nowadays by means of a lower p-type zone (bottom isolation) (formed by means of an implantation into the substrate before forming the n-type epitaxial layer) and an upper p-type zone (top isolation), which merge with one another via diffusion. These diffusions—desired by means of the heat treatments—of the dopants for the production of the isolation zone and the contact also lead, of course, to radially symmetrically extended diffusion zones. The latter in turn govern the large space requirement of the diffusion isolation and the diffusion contact on the silicon chip.

One embodiment of the invention enables an integration concept for a space-saving substrate contact-connection without the use of a diffusion contact or a substrate contact-connection, wherein the lateral outdiffusion is suppressed. Furthermore, the invention enables a simultaneous realization of isolation and substrate contact by means of a deep trench.

Two possible variants have been described previously for a substrate contact with the aid of DTI (Deep Trench Isolation). In the first variant, a substrate contact is produced in the deep trench in addition to the isolation of the epitaxial wells. For this purpose, the isolation in the trench achieved by means of a TEOS deposition is opened by means of a spacer etch at the bottom of the isolation trench. The opened deep trench is subsequently filled with a deposition of a conductive material, for instance p-polysilicon. In order to improve the connection to the substrate, a high p-type dose may also be implanted in the trench bottom prior to the poly deposition, although this requires an additional lithography plane. Accordingly, by way of example, after the partial filling of the deep trenches with TEOS oxide (for approximately 2 μm wide trenches e.g. 100-500 nm), the trenches are opened at the bottom by means of a dry-chemical TEOS oxide etch (spacer etch). Afterward, by means of a further lithography, the doping is increased in the trench bottom and filling with p-doped poly is effected or, as an alternative, filling with p-doped poly is effected directly.

In the second variant, the deep trench is used in order to delimit the lateral outdiffusion of the doping profiles which form the substrate contact, in order to save area. This can, moreover, be combined with the "dual well process" (bottom isolation is implanted areally before the n-type buried layer) in order to save a lithography plane. Since a great lateral outdiffusion of the bottom isolation is unimportant due to the delimitation with deep trenches, it is possible to realize the upper connection with an existing shallower p-type well and thus additionally to save a further lithography plane. In the second variant, a region in which the outdiffusion of the two p-type implantations is delimited is defined by means of the outer walls of adjacent deep trenches in the layout. The buried layer is to be opened in this region.

Accordingly, in the second variant, the n-type buried layer is interrupted in the region of the desired substrate contact with the aid of the "dual well" principle, and an areal p-type doping is implanted on the wafer. In this case, a thicker thermal oxide masks the n-doped buried layer and the implantation is effected in the substrate contact opening. As a result, a p-type buried layer arises alongside the n-type buried layer. This region is subsequently enclosed with deep trenches. During a subsequent diffusion of the p-type buried layer, the deep trench then constitutes a lateral barrier for the dopant. As a result, the dopant can outdiffuse only in the direction of the surface and the substrate. This effect is desirable in order to subsequently obtain the connection downward to the substrate with a p-type well implanted from above.

Both variants involve saving a lithography plane (in addition to the enormous gain in area) since the diffusion isolation zone is normally produced with two isolation planes (bottom isolation prior to deposition of the epitaxial layer and top isolation after deposition of the epitaxial layer).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, with a semiconductor body, comprising:
    a substrate of a first conduction type;
    a buried semiconductor layer arranged on the substrate; and
    a functional unit semiconductor layer arranged on the buried semiconductor layer, in which at least two semiconductor functional units arranged laterally alongside one another are provided, the functional unit semiconductor layer having a surface that does not adjoin the buried semiconductor layer and forms a surface of the semiconductor component;
    wherein the conduction type of the substrate is opposite to the conduction type of the buried semiconductor layer and/or the functional unit semiconductor layer;
    wherein the buried semiconductor layer is a part of the at least one semiconductor functional unit, and the semiconductor functional units are electrically insulated from one another by an isolation structure which permeates the functional unit semiconductor layer, the buried semiconductor layer and the substrate; and
    wherein the isolation structure comprises at least one trench and an electrically conductive contact to the substrate, the electrically conductive contact to the substrate being electrically insulated from the functional unit semiconductor layer and the buried layer by the at least one trench, the sidewalls of which are at least partly covered with an insulating layer and the interior of which is completely filled with an electrically conductive material which makes electrical contact with the substrate and extends as far as the surface of the semiconductor component.

2. The semiconductor component of claim 1, wherein the electrically conductive material is a semiconductor material of the first conduction type.

3. The semiconductor component of claim 2, wherein that part of the substrate which adjoins the electrically conductive semiconductor material has a doping intensity which is higher than the doping intensity of the substrate.

4. The semiconductor component of claim 1, wherein a silicide is formed at least on the bottom of the trench, and wherein the electrically conductive contact is made of a semiconductor material of an arbitrary conduction type.

5. The semiconductor component of claim 4, wherein the silicide is one of a group comprising TiSi, WSi, CoSi, TaSi, HfSi, HfSiOx, other transition-metal-semiconductor compounds, and electrically conductive nitrides and carbides.

6. The semiconductor component of claim 1, wherein the electrically conductive contact comprises a metal.

7. The semiconductor component of claim 6, wherein the electrically conductive contact is one of a group comprising Ti, W, Co, Al, Cu, transition metals and their semiconductor compounds, silicides, graphite, and electrically conductive nitrides and carbides.

8. The semiconductor component of claim 1, wherein the isolation structure comprises two trenches and a semiconducting zone of the first conduction type situated between the trenches.

9. The semiconductor component of claim 8, wherein the semiconducting zone comprises a buried layer of the first conduction type and a doped region of the first conduction type.

10. The semiconductor component of claim 8, wherein the trenches are filled with an insulating material.

11. A semiconductor component comprising:
    a substrate of a first conduction type;
    a buried semiconductor layer arranged on the substrate; and
    a functional unit semiconductor layer arranged on the buried semiconductor layer and configured with at least two semiconductor functional units arranged laterally alongside one another, the buried semiconductor layer configured as a part of at least one of the semiconductor functional units;

the functional unit semiconductor layer having a surface that does not adjoin the buried semiconductor layer and forms a surface of the semiconductor component;

wherein the conduction type of the substrate is opposite to the conduction type of the buried semiconductor layer and/or the functional unit semiconductor layer;

at least one trench permeating the functional unit semiconductor layer, the buried semiconductor layer and the substrate; and an electrically conductive contact to the substrate, the electrically conductive contact to the substrate being electrically insulated from the functional unit semiconductor layer and the buried layer by the at least one trench;

wherein the at least one trench is configured as an isolation structure that electrically insulates the semiconductor functional units from one another;

wherein the isolation structure comprises a trench, the sidewalls of which are at least partly covered with an insulating layer and the interior of which is completely filled with an electrically conductive material which makes electrical contact with the substrate, and wherein the electrically conductive material is a semiconductor material of the first conduction type and extends as far as the surface of the semiconductor component.

12. The semiconductor component of claim 11, wherein that part of the substrate which adjoins the electrically conductive semiconductor material has a doping intensity which is higher than the doping intensity of the substrate.

13. The semiconductor component of claim 11, wherein the isolation structure comprises two trenches and a semiconducting zone of the first conduction type situated between the trenches.

14. A semiconductor component comprising:
a substrate of a first conduction type;
a buried semiconductor layer arranged on the substrate; and
a functional unit semiconductor layer arranged on the buried semiconductor layer and configured with at least two semiconductor functional units arranged laterally alongside one another, the buried semiconductor layer configured as a part of at least one of the semiconductor functional units, the functional unit semiconductor layer having a surface that does not adjoin the buried semiconductor layer and forms a surface of the semiconductor component;

wherein the conduction type of the substrate is opposite to the conduction type of the buried semiconductor layer and/or the functional unit semiconductor layer; and means permeating the functional unit semiconductor layer, the buried semiconductor layer and the substrate for electrically insulating the semiconductor functional units from one another, said permeating means comprising at least one trench and an electrically conductive contact to the substrate, the electrically conductive contact to the substrate being electrically insulated from the functional unit semiconductor layer and the buried layer by the at least one trench;

wherein the at least one trench is configured as an isolation structure, and wherein the at least one trench sidewalls that are at least partly covered with an insulating layer and has an interior that is completely filled with an electrically conductive material that makes electrical contact with the substrate and extends as far as the surface of the semiconductor component.

15. The semiconductor component of claim 14, wherein the electrically conductive contact is made of a semiconductor material of the first conduction type and wherein that part of the substrate which adjoins the electrically conductive semiconductor material has a doping intensity which is higher than the doping intensity of the substrate.

* * * * *